(12) United States Patent
Schmuki et al.

(10) Patent No.: US 6,518,603 B1
(45) Date of Patent: Feb. 11, 2003

(54) SELECTIVE ELECTROCHEMICAL PROCESS FOR CREATING SEMICONDUCTOR NANO- AND MICRO-PATTERNS

(75) Inventors: Patrik Schmuki, Crissier (CH); Lynden Erickson, Cumberland; David J. Lockwood, Vanier, both of (CA)

(73) Assignee: National Research Council of Canada, Ottawa (CA)

( * ) Notice: Subject to any disclaimer, the term of this patent is extended or adjusted under 35 U.S.C. 154(b) by 0 days.

(21) Appl. No.: 09/695,798

(22) Filed: Oct. 25, 2000

Related U.S. Application Data (62) Division of application No. 09/196,641, filed on Nov. 19, 1998.

(51) Int. Cl.$^7$ .......................... H01L 33/00; H01L 29/30
(52) U.S. Cl. ...................... 257/102; 257/103; 257/617
(58) Field of Search ........................... 257/617, 16, 14, 257/102, 103; 438/745, 750

(56) References Cited

U.S. PATENT DOCUMENTS

| | | | | |
|---|---|---|---|---|
| 4,588,447 A | * | 5/1986 | Golecki | 148/1.5 |
| 4,946,735 A | * | 8/1990 | Lee et al. | 428/220 |
| 5,023,696 A | * | 6/1991 | Ogino | 357/60 |
| 5,258,322 A | * | 11/1993 | Sakaguchi et al. | 438/409 |
| 5,454,915 A | * | 10/1995 | Shor et al. | 204/129.3 |
| 6,309,945 B1 | * | 10/2001 | Sato et al. | 438/409 |

OTHER PUBLICATIONS

"Fabrication of visibly photoluminescent Si microstructures by focused ion beam implantation and wet etching," J. Xu and A. J. Steckl Applied Physics Letters 65, 2081 (1994).

"Enhancement and suppression of the formation of porous silicon," S. P. Dattagupta, C. Peng, P. M. Fauchet, S. K. Kurinec, and T. N. Blanton, Journal of Vacuum Science and Technology B 13, 1230 (1995).

"Ion–irradiation control of photoluminescence from porous silicon," J. C. Barbour, D. Dimos, T. R. Guilinger, M. J. Kelly, and S.S. Tsao, Applied Physics Letters 59, 2088 (1991).

Hirschman et al Silicon–Based Visible Light–Emitting Devices Integrated Into Microelectronic Circuits Nov. 1996, Nature vol. 384 pp. 338–341.*

Stecki et al Doping–Induced Selective Area Photoluminescence in Porous Silicon Apr. 1993 American Institute of Physics Applied Physics Letters vol. 62 (16) pp. 1982–1984.*

* cited by examiner

Primary Examiner—Olik Chaudhuri
Assistant Examiner—David S Blum
(74) Attorney, Agent, or Firm—Lawrence E. Laubscher, Jr.

(57) ABSTRACT

A porous semiconductor is created by electrochemical etching. Selected regions of a semiconductor are first treated to reduce the threshold potential at which pore formation occurs, and then an electrochemical etch is carried out on the semicnoductor at a potential at least equal to the reduced threshold potential for the selected regions and less than the threshold potential for untreated regions. The selective treatment preferably involves implantation with the same ions as the semiconductor, i.e. Si ions for silicon. The treatment results in the formation of highly defined etch patterns or patterns of porous material depending on the process conditions.

6 Claims, 6 Drawing Sheets

(1 of 6 Drawing Sheet(s) Filed in Color)

SELECTIVE ELECTROCHEMICAL PROCESS FOR CREATING SEMICONDUCTOR NANO- AND MICRO-PATTERNS

This application is a division of application Ser. No. 09/196,641 filed Nov. 19, 1998.

FIELD OF THE INVENTION

This invention relates to the field of semiconductor technology, and in particular a method for selectively creating semiconductor nano- and micro-patterns, such as etch patterns or porous patterns.

BACKGROUND OF THE INVENTION

Considerable interest has been shown recently in porous semiconductors because of their good properties for use in sensors and electroluminescent devices. Silicon is currently the technologically most important semiconductor material. However, applications in semiconductor photonics seemed unlikely due to its indirect electronic band gap. The discovery of electrochemically formed visible light emitting porous Si has, in the past few years, stimulated intense and increasing research activity. The main reason for this tremendous interest is the prospect of light emitting devices made of porous Si.

Prior approaches to producing porous Si patterns mostly use photolithographic techniques. The fabrication of porous semiconductors, for example, of silicon or GaAs, requires a lithography/microfabrication process to create nano- or micro- structures on semiconductor wafers. Examples of papers which describe such structures and techniques for their fabrication: "Doping-induced selective area photoluminesence in porous silicon", A. J. Steckl, J. Xu, H. C. Mogul and S. Mogren, Applied Physics Letters, 62 (16) 1982 (1993); "Fabrication of visibly photoluminescent Si microstructures by focused ion beam implantation and wet etching", J. Xu and A. J. Steckl Applied Physics Letters 65, 2081 (1994); "Enhancement and suppression of the formation of porous silicon", S. P. Dattagupta, C. Peng, P. M. Fauchet, S. K. Kurinec, and T.N. Blanton, Journal of Vacuum Science and Technology B 13, 1230 (1995); "Ion-irradiation control of photoluminescence from porous silicon", J. C. Barbour, D. Dimos, T. R. Guilinger, M. J. Kelly, and S. S. Tsao, Applied Physics Letters 59, 2088 (1991); and "Silicon-based visible light emitting devices integrated into microelectronic circuits", K. D. Hirschmann, L. Tsybeskov, S. P. Dattagupta, and P. M. Fauchet, Nature (London) 384, 338 (1996).

Large area porous surfaces on semiconductor substrates are typically produced in two. ways, both of which use a wet etch process. One method uses an electrochemical process in which a small electric current is passed through an electrolyte to the substrate to etch the sample. A second method uses a stain etch to accomplish the same end with no externally applied electric current. The entire exposed area of the substrate is etched. The creation of nano- or micro-patterned porous semiconductors requires some technique for restricting the etch process to areas within the nano- or micro- pattern and inhibiting the process elsewhere. Several methods have been proposed to restrict the etch process to the micropatterned areas.

In one technique, an electrochemical resistant mask, which allows the electrolyte to reach the semiconductor surface only in areas where a porous surface is required, is bonded onto the substrate. The disadvantage of this method is that one must apply an electrochemical resistant layer (such as $Si_3N_4$) to the substrate, pattern it using photolithography, etch the pattern through the electrochemical resistant layer without etching the substrate, electrochemically etch to produce the porous surface, and then remove the electrochemical resistant layer. This is an unduly complex process. The smallest structures that can be created are limited by the resolution of the photolithography/microfabrication of the chemical resistant layer.

In another technique, the substrate is amorphized (i.e. the crystal structure is destroyed) by implanting ions at a high dose in areas where a porous surface is not desired. Amorphizing the sample requires a large dose of ions which affect the electrical characteristics of the material. Since the amorphization is required everywhere where a porous surface is not desired, and since the other areas may be used for electrical finctions, this process can leave the semiconductor in a state unsuitable for use in a device. The implanted ions are impurities in the sample. In addition, after amorphization, a high temperature anneal is required to regrow the crystal structure. Since impurities in the semiconductor migrate during this heating process, the total anneal time is limited for the completed device (thermal budget). This one step alone will use a substantial part of this limited anneal time.

Photo-assisted electrochemistry can be employed wherein the sample is illuminated through an optical mask while the surface is etched electrochemically. The resolution of the photo-assisted electrochemical process has both a photolithography (diffraction) limit and a limit imposed by the lifetime of the optical carriers as they migrate from the illuminated region into the dark region. These optical carriers are necessary for etching, so the etched boundary will be diffuse (or smeared).

The surface can be ion milled (dry etched) in areas where a porous surface is required. The electrochemical etching process is enhanced in areas which have been ion milled. The ion milled surface etches faster than the non-ion milled surface. So the surface is etched everywhere. This process is not totally selective. Another drawback is that the ion milling produces a shallow trench.

Alternatively, advantage can be taken of the fact that the incubation time for pore formation is strongly dependent on the impurity concentration (doping) of the substrate. By locally doping the wafer and then the annealing substrate, micropattemed porous silicon has been produced by stain etching under illumination. If the incubation time of the neighboring areas exceeds the total etch time in the implanted areas, a totally selective etch process is achieved. If there is no annealing, the process is a partially selective negative process similar to the amorphization process described above.

This latter process is totally selective only if the incubation time contrast between implanted regions and the non-implanted regions is greater than the total etch time required in the implanted regions. If not, a porous surface is produced everywhere, with significantly enhanced etching in the implanted regions. Dopant ions are used which modify the electrical characteristics of the substrate (but only in the neighborhood of the porous Si areas). A thermal treatment is required using some of the thermal budget.

An object of the invention is to alleviate the disadvantages of the prior art.

SUMMARY OF THE INVENTION

According to the present invention there is provided a method of selectively creating a patterned semiconductor by electrochemical etching, comprising the steps of treating selected regions of a semiconductor to reduce the threshold potential at which pore formation occurs during an electrochemical etch; and carrying out an electrochemical etch on said semiconductor at an anodic potential at least equal to said reduced threshold potential for said selected regions and less than the threshold potential for untreated regions to selectively form patterns in said selected regions.

The formed patterns are typically patterns of porous material, when it is desired to form a porous semiconductor, but can also be highly defined etch patterns, for example, lines, gratings, or pits, formed in the implanted regions.

The invention depends on the novel effect discovered by the inventors that the threshold potential at which a porous surface is created can be selectively reduced where the near (sub) surface of a semiconductor is modified, preferably by implanting ions, although other means could be employed). The electrochemical step is performed in the range between the. reduced threshold potential and the normal threshold anodic potential required to produce pores on the untreated substrate. This is attributed to Schottky barrier breakdown, which is facilitated due to an inhomogeneous field distribution at a defect site.

The choice of etchant is determined by the substrate material. Typically, the etchant will be hydrochloric acid, hydrobromic acid, or hydrofluoric acid.

Typically the substrate is silicon and the implanted ions are silicon ions so that no impurities are introduced into the substrate by the ion implantation process. The etchant in this case may be hydrofluoric acid. Other types of ions can be used.

Alternatively, the substrate may be GaAs, in which case the etchant may typically be hydrochloric or hydrobromic acid. Desirably, in the case of a doped semiconductor, the implanted ions should be the same as the dopant. Typically, in the case of GaAs, the dopant and implanted ions would be Si.

In order to form pores, the substrate needs to be partially dissolved. In the case of an electrochemical etch of silicon with HF, the Si has to be oxidized at or near the wafer surface. This happens when holes ($h^+$) are present at or near the wafer surface. For ntype material, at positive potentials the material is depleted in holes and thus does not dissolve. However, light with an energy greater than or equal to the band gap will create electron-hole pairs. The holes migrate to the wafer surface and can cause dissolution to occur in untreated areas. The process in accordance with the invention, and in particular the electrochemical etch, should therefore normally be carried out in under "dark" conditions, by which it is understood that no significant amount of light is present having an energy greater than or equal to the band gap to thereby avoid the presence of photoinduced carriers. It will be understood by one skilled in the art that illumination that does not create photoinduced carriers will of course have no significant effect on the process and the term "dark conditions" as used in this specification is considered to include the presence of such illumination that does not create significant photoinduced carriers in the semiconductor.

The sensitization of the substrate can be achieved by other means. In case of both GaAs and silicon, a scratch on the surface can be used for sensitization of the substrate. Other techniques for creating crystal defects can be used to initiate the process according to the invention.

Thus, in accordance with the invention the threshold for pore production is modified, for example, by implanting ions into the substrate. The process is totally selective, which means the substrate is not modified in any way except in the porous areas. In the case of ion implantation, the implant doses are less than those required for amorphization.

The smallest structure that miay be created is limited only by the ion beam dimensions or, in the case of a broad beam implantation, by the mask used to limit the exposure to those areas which are to be made porous. The process is simple, requiring only an implantation and an electrochemical step.

BRIEF DESCRIPTION OF THE DRAWINGS

The file of this patent contains at least one drawing executed in color. Copies of this patent with color drawing (s) will be provided by the Patent and Trademark Office upon request and payment of the necessary fee.

The invention will now be described in more detail, by way of example, only with reference to the accompanying drawings, in which:FIG.

FIG. 4 shows the room temperature photoluminescence spectrum acquired in the center of the square shown in FIG. 3a;

FIG. 7 shows an AFM height cross section through the grating pattern within the square of FIG. 6a.

DESCRIPTION OF THE PREFERRED EMBODIMENTS

An undamaged silicon substrate was subjected to an electrochemical etch in hydrofluoric acid, and the current density measured for different anodic potentials measured against a saturated calomel electrode (SCE). This resulted in the plot shown in FIG. 1 for the sample under test. This is a current-voltage polarization curve of n-type Si(100) (doped with $5\times10^{15}$ As $ions/cm^{-2}$) in 20% HF (solid line) and the polarization curve acquired with a 300 $\mu$m diameter capillary electrode on a 50×50 $\mu$m square implanted with $3\times10^{14} cm^{-2}$ $Si^{++}$ (dashed line). The curves were acquired in the dark. The potentials are referred to the saturated calomel electrode (SCE). At potentials of less than about −0.5 Volts SCE substantially no current flows. At about 0.5 Volts the current density increases sharply to about $10^{-6}$ $A/cm^2$, after which it remains flat until about 3.8 Volts, whereupon it starts to rise gradually. No pore production occurs on the untreated substrate until the untreated threshold of 3.8 Volts is reached. The threshold is heavily dependent on substrate doping, but also dependent on the HF concentration, electrolyte composition, and temperature.

The substrate was then selectively subjected, using a focussed ion beam instrument, to implantation of silicon ions at a low dosage. The implant dose is less than that required for amorphization. The silicon ions do not introduce impurities into the substrate.

The current density was then measured again for the areas selectively treated by ion implantation. The results are shown by the dotted line in FIG. 1. Compared to the untreated areas, the current density for the treated areas undergoes a sharp rise at about +0.25 Volts and then gradually increases with increasing anodic potential. This represents a lower threshold at which pore production occurs in the untreated areas. In the range between the lower threshold of 0.25 Volts for the untreated areas and 3.8 Volts for the untreated areas, pore production only occurs in the treated areas. This provides a powerful mechanism for selectively creating pores in a substrate.

Figure 2:
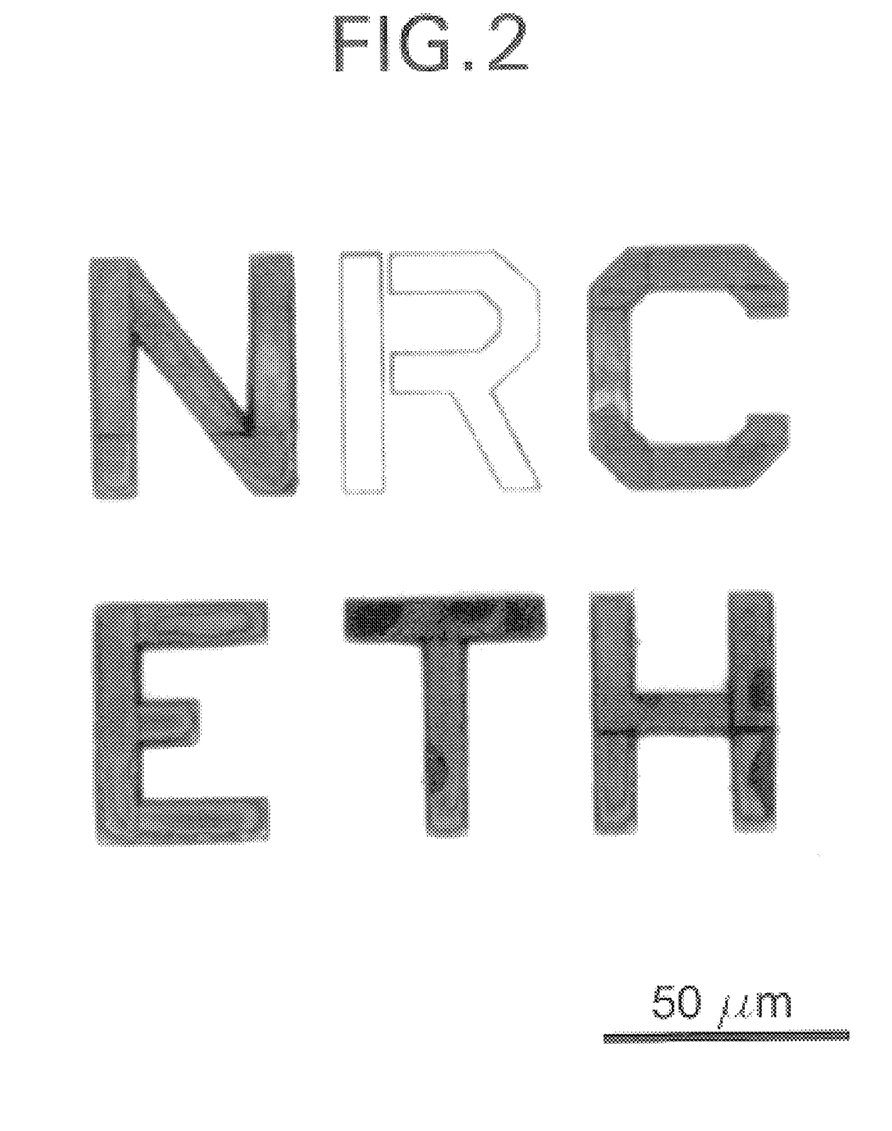
FIG. 2 is an optical micrograph of porous Si letters produced by $Si^{++}$ FIB implantation.

FIG. 2 shows a pattern etched by a technique in accordance with the invention. The smallest structure that may be created is limited by the size of the implanting beam. For a focussed ion beam, this may be as small as 50 nm. 200 nm resolution has been demonstrated with the technique in accordance with the invention.

EXAMPLES

Experiments were carried out on a n-type silicon (100) wafer doped with $5 \times 10^{15}$ As ions/cm$^2$. The wafer conductivity was 1–10 Ohm-cm. Contact metal was smeared on the back surface of the wafer. The front surface was pressed against an O-ring on the electrochemical cell. Electrical connections were made from the rear electrode to the working connection of a potentionstat (Jaissle 1002 T-NC) from a Pt-gauze electrode in the electrolyte to the counter electrode connection of the potentiostat and from a calomel electrode in the electrolyte to the reference electrode connection of the potentiostat. The electrical potential between the electrodes was stepped from −0.5V to 3.5 V at 10 m V/5 seconds. The sample was in the dark.

Si$^{++}$ was used as the implanting species to avoid any doping effects of the implantation and at a sufficiently high energy to minimize surface sputtering effects. From an Au-Si liquid metal ion source, Si$^{++}$ ions were selected at 200 keV using an ExB mass filter and implanted in the wafer at room temperature using a 100 kV JEOL 104 UHV FIB system with a nominal bearnwidth of 100 nm at 24 pico Amperes. By vector scanning the ion beam, different patterns (squares, lines, letters, dots) were implanted. Each pattern was implanted with dosages of $3 \times 10^{13}$, $10^{14}$, $3 \times 10^{14}$, $10^{15}$, $3 \times 10^{15}$, $10^{16}$, and $3 \times 10^{16}$ ions cm$^{-2}$. For doses greater than $10^{15}$ cm$^{-2}$, the implanted features can be faintly detected with a scanning electron microscope (SEM). This can be attributed to amorphization of the substrate occurring at higher implantation doses or to defectinduced surface bulging.

The number and distribution of defects created by the implantation as well as of the sputter yield were estimated by calculations using TRIM code. The vacancy depth-profile calculation shows that the creation of vacancies occurs immediately below the surface, and peaks at 270 nm below the surface. About 1500 unrecombined vacancy/interstitial pairs are formed for one incoming ion and a sputter yield of less than 0.2 is obtained. Hence the calculations show that surface sputter effects can be neglected, and that most defect creation occurs in a near surface region of the Si substrate.

The implanted samples were then electrochemically treated in 20% HF by stepping the voltage (potential) from −0.5 V to different anodic potentials with a rate of 10 mV every 5 s. In contrast to conventional porous Si formation on n-type material, the electrochemical treatment was always performed in the dark to avoid light-Induced carrier generation in the semiconductor sample. Under these conditions (similar to the diode behavior of a p/n junction under reverse bias), the holes (h$^+$) necessary for Si$^0$ oxidation and dissolution as (SiF$_6$)$^{2-}$ become only sufficiently available at the Si surface at potentials where Schottky barrier breakdown occurs.

Figure 1:
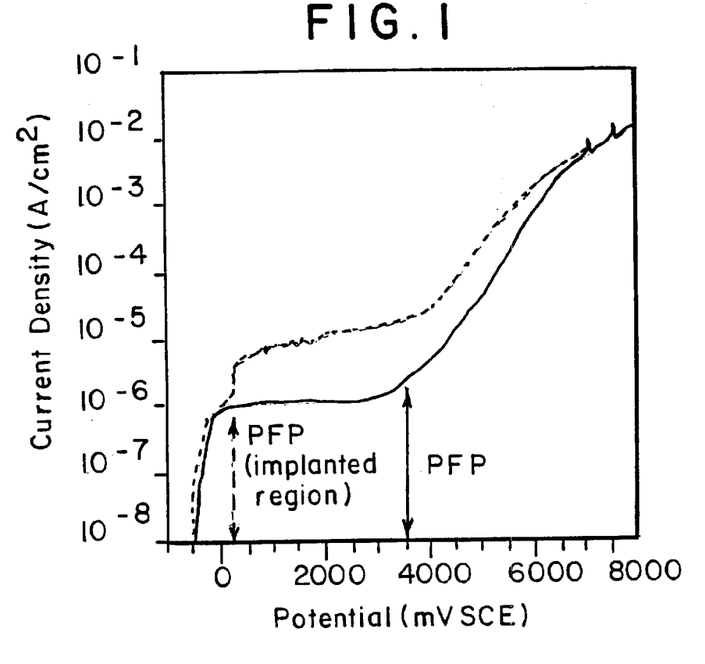
FIG. 1 is a plot of current density against anodic potential for an n-type silicon (100) substrate subject to an electrochemical etch in 20% HF in the dark.

FIG. 1, referred to above, shows the typical current/voltage characteristic for a reference (nonimplanted) n-type Si sample in 20% HF. Starting from the open circuit potential, with an increasing voltage (potential) the current increases up to a plateau region. In this region, the current is controlled by electrons that overcome the charge carrier depletion region (Schottky barrier) at the semiconductor/electrolyte interface by thermal activation or tunneling.

At a potential of approximately 3.8 V versus the saturated calomel electrode (SCE), the current steeply increases. In this region, local dissolution processes occur on the Si surface which, after extended polarization, lead to a porous surface. Hence this potential is called the pore formation potential (PFP). There are a variety of factors that influence the PFP such as the concentration of the anion in the electrolyte or the temperature. The predominant factors are, however, the conduction type and doping concentration of the substrate, as expected from the Schottky approach.

In addition, the defects created by the focused ion beam (FIB) also have a drastic effect on the PFP. This is clear from the second curve included in FIG. 1 which shows a polarization curve acquired with a microelectrode pipette ($\phi$=300 $\mu$m) that was placed on a 50×50 $\mu$m implanted square (dose=$3 \times 10^{14}$ cm$^{-2}$). In this case, a first significant current increase appears at +0.25 V SCE.

Although the implanted area is only about 3% of the total area exposed to the electrolyte, the current density in the plateau region is more than a decade higher than for the reference sample. Hence, the effective current density in the implanted region is about 300 times higher than on the intact Si surface; i.e., it becomes comparable to current densities observed with the reference sample above the PFP. If the voltage scan with implanted samples is stopped at 3.5 V, i.e., below the overall PFP, then a surface morphology as shown in the micrographs of FIGS. 2 and 3 is obtained.

FIG. 2 shows an optical micrograph of porous Si letters produced by Si$^{++}$ FIB implantation in n-type Si (100) and subsequent electrochemical polarization in 20% HF from −0.5 V SCE to 3.5 V SCE at a dose of $3 \times 10^{14}$ cm$^{-2}$. The letters show the typical porous Si interference colors ranging from red to green. The letter R was outlined with a single FIB (100 nm) line, which results in a linewidth of approximately 300 nm. The rest of the letters were uniformly implanted.

Figure 3A:
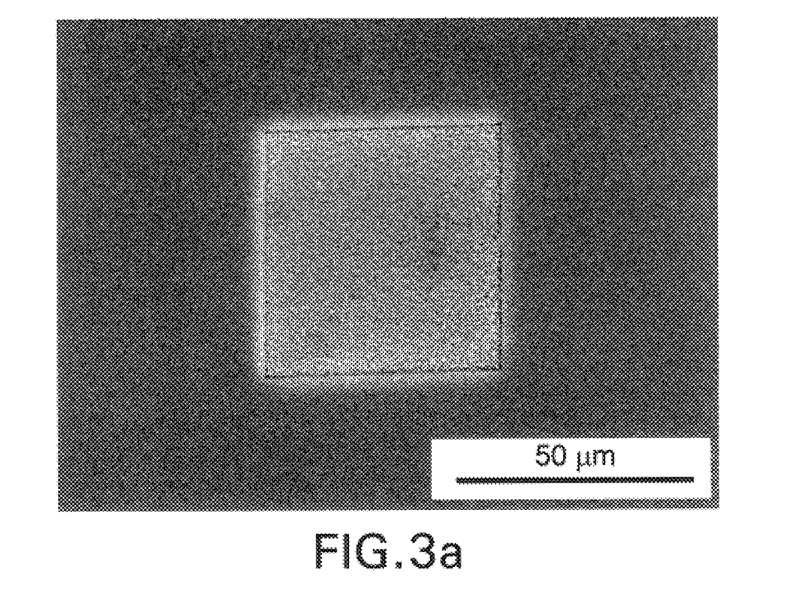
FIG. 3a is a SEM image of a 50×50 $\mu$m square implanted with $3\times10^{14}$ $cm^{-2}$ Si after polarization in 20% HF from −0.5 to 3.5 V.
Figure 3B:
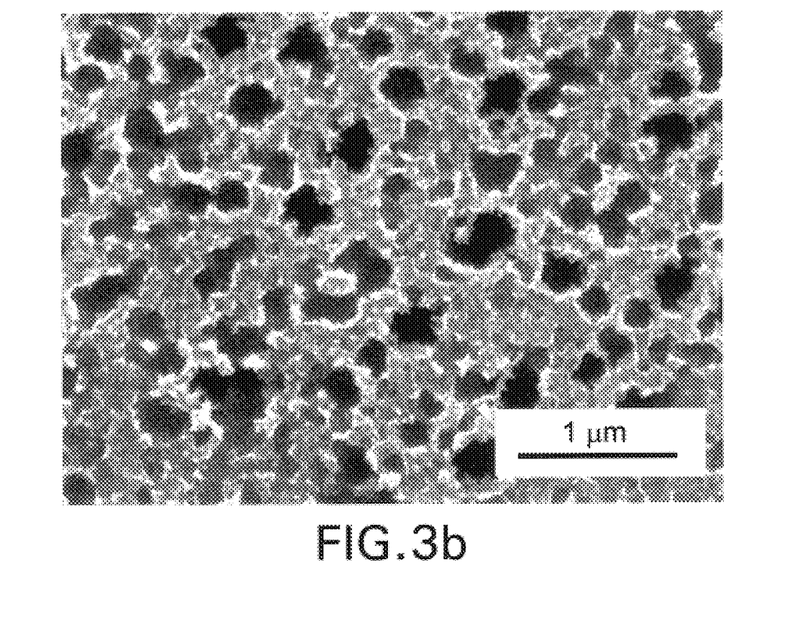
FIG. 3b shows a higher magnification of (a) within the square.

FIG. 3(a) shows a SEM micrograph of a square implanted with the same dose ($3 \times 10^{14}$ cm$^{-2}$) and identically treated. From FIG. 3(b), it is apparent that porous Si has been formed within the square. The surrounding area is completely unattacked.

Figure 4:
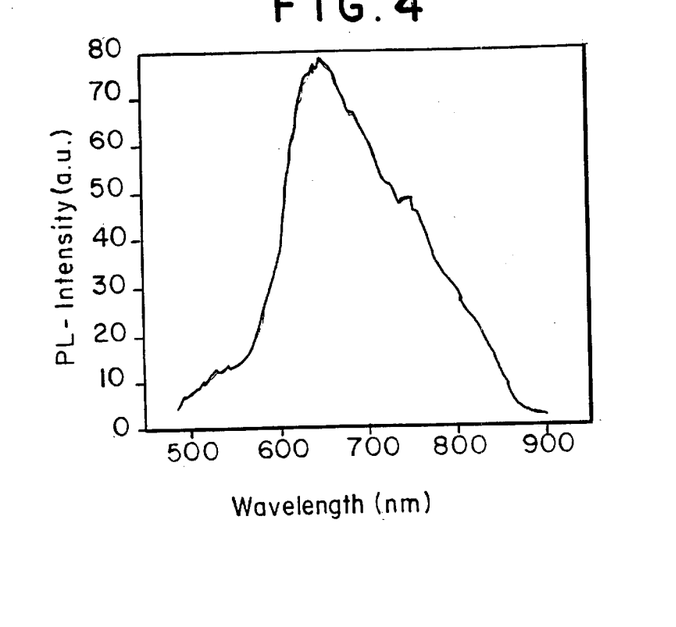

The photoluminescence (PL) spectrum in FIG. 4 was measured with an argon laser beam focused in the center of the 50 $\mu$m square of FIG. 3. The spectrum was excited using 15 mW of 457.9 nm argon laser light, dispersed with a Spex 14018 double spectrometer, and detected with a cooled RCA 31034A GaAs photomultiplier. The PL spectrum peaks at 655 nm in the orange-red region of the spectrum and, in width and wavelength position, is typical of the PL response of porous Si. The band shape shows irregularities that can be attributed to nanoscopic nonuniformities in the material porosity.

Electrochemically treated areas next to the implanted patterns were investigated as a reference and, in every case, the unimplanted areas showed the spectral behavior of a clean Si surface (no light emission in the visible range) as did implanted areas not yet electrochemically treated. This clearly indicates that the electrochemical formation of porous Si is responsible for the PL observed and not lattice defects or amorphization created by the implantation.

It is thus clear that, at the FIB created defects, pore growth can be triggered at voltages significantly lower than at the intact area. This can be attributed to Schottky barrier breakdown, which is facilitated at defects due to an inhomogeneous field distribution at a defect site. In other words, in the potential range between the PFP of the implanted area (+0.25 V) and the PFP of the untreated area (+3.8 V), pores can be selectively formed at ion beam treated parts of the sample. This is in complete contrast with the prior art, where the usual electrochemical treatment using constant current and p-type material, or n-type material under illumination, resulted in porous Si formation only in unimplanted regions.

This discrepancy must be associated with the different experimental conditions, i.e., the use of n-type material in the dark which makes the availability of $h^+$ at the surface the determining criterion for dissolution.

With a set of samples, polarization experiments were performed by acquiring a polarization curve from −0.5 to 1, 2, 3.5, and 5 V. For all voltages and for all investigated implantation doses, selective dissolution or etching was observed. As expected for the sample that was exposed to 5 V (i.e., anodic to the overall PFP), etching was not confined to the implanted areas but spread over the entire surface. The rest of the samples showed that the morphology of the selective attack depends strongly on the implantation dose and on the electrochemical treatment.

Samples implanted with doses greater than $10^{15}$ $cm^{-2}$ and treated up to 3.5 V showed a selective etching of the entire implanted area rather than pore formation. For samples implanted with a dose of less than $10^{14}$ $cm^{-2}$ and treated to 1 V, pore formation was not uniform and only some porous patches were formed within the implanted area.

The highest PL intensity was observed from the sample implanted with a dose of $3\times10^{14}$ $cm^{-2}$ and polarized to 3.5 V (FIG. 4). Other conditions led to significantly lower PL intensities.

PL intensity and morphology of the samples correlate in that, for the highest PL sample, the highest amount of porosity with feature sizes in the nanoscopic range was found, which is consistent with a quantum confinement explanation for the red PL of porous Si.

The local dissolution process occurred in the implanted area and did not follow the crystal orientations of the bulk Si not only for lines and single line letters, but also for circular shapes, i.e., no branching out of the etch was observed along undamaged crystalline Si planes, and the etching stopped when the underlying undamaged crystalline Si was reached. This indicates that the reaction activation energy at defects is much lower than for crystal planes exposed during the dissolution.

The present invention permits the production of laterally confined light emitting Si by a direct writing process. The creation of surface defects followed by an electrochemical treatment, tailored to trigger dissolution at defects, can be used to form visible light emitting porous Si selectively. At present, the size of the structures appears to be limited only by the diameter of the writing ion beam. Thus patterns in the 50 to 200 nm range are possible.

Recently, electroluminescent devices based on large scale porous Si structures have been reported. The present invention could facilitate a drastic shrinkage of such device dimensions and hence could be a basis for (or part of) a process leading to extremely high resolution optoelectronic applications.

The surface lattice defects represent centers of enhanced dissolution, and hence represent the initiation site for pore formation, when conditions are established where Schottky barrier breakdown is the rate-determining step for the surface dissolution reaction.

Figure 5:
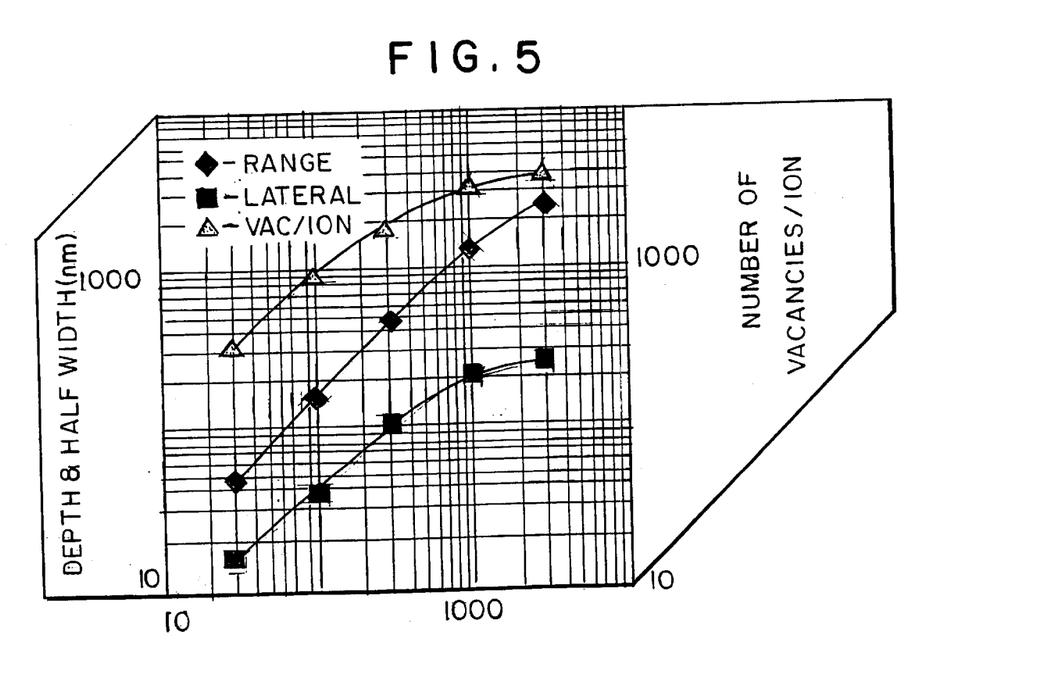
FIG. 5 shows the depth of implant vs. ion energy.

The ion energies employed are not critical except that the depth of the pore structure is limited to the depth of the implant. FIG. 5 shows the depth of implant vs. ion energy. As the ion energy increases, the width of the implant increases as does the number of vacancies created for each incident ion. The ion dose should be adjusted for each ion energy to optimize the pore structure. It should also be noted that as the ion energy increases, the ion induced sputtering (etching) of the surface decreases. Generally, ion energies exceeding 10 KeV are suitable. Energies less than this lead to a very shallow pore structure and significant surface sputter etching.

In addition to creating porous patterns, the above technique can be applied to achieve uniform dissolution in the implanted areas. Whether pore formation or uniform material etching is obtained within the implanted regions depends not only on the implant dose, the polarization voltage, and the exposition time but also on the geometry of the structure. The lower the dose, the less anodic the potential, the shorter the exposition time, and the larger the implanted feature, the more a tendency to pore formation rather than uniform material removal was obtained. This finding can be explained if one considers large scale etching of semiconductors, where the morphology of the dissolution process, that is whether pore formation or electropolishing conditions are established, depends on the rate controlling step. Kinetic control leads to pore formation, diffuision control to uniform material etching. Hence, uniform etching is expected for high current densities and a narrow geometry of the etched cavity.

In order to demonstrate uniform etching, wafers of n-type Si (100) were doped with $10^{16}$ $cm^{-3}$ As and n-type GaAs (100) wafers were doped with $2.5\times10^{17}$ $cm^{-3}$ Si. Ion implantation patterns were written in the substrates at room temperature with a 100 kV JEOL 104 UHV FIB system. $Si^{++}$ ions from a Au-Si liquid metal ion source were selected (at 200 keV) using an E x B mass filter. The nominal beam width—controlled by an aperture—was 100 mn. By vector scanning the ion beam, different shapes were implanted with dosages of $3\times10^{13}$, $10^{14}$, $3\times10^{14}$, and $10^{15}$ ions/$cm^2$. Prior to each electrochemical experiment the samples were degreased by sonicating in isopropanol and methanol, rinsed with deionized water and then were blown dry in Ar gas. Contact to the samples was established by smearing In/Ga onto the backside of cleaved pieces. The samples were then pressed against an O-ring in an electrochemical cell, leaving 0.79 $cm^2$ exposed to the electrolyte. Electrochemical characterization and etching was carried out in 20% HF for Si and 1 M HCl for GaAs by potential sweep experiments (polarization curves) where the potential was stepped by 10 mV every 2 seconds in the anodic direction. The potentials were reported versus the saturated calomel electrode (SCE). All electrochemical experiments were carried out in the dark. Scanning electron microscope (SEM) micrographs were acquired using a JEOL 840A SEM. Morphological images were acquired using the tapping mode of a Digital Instruments (Nanoscope III) atomic force microscope (AFM).

Figure 6A:
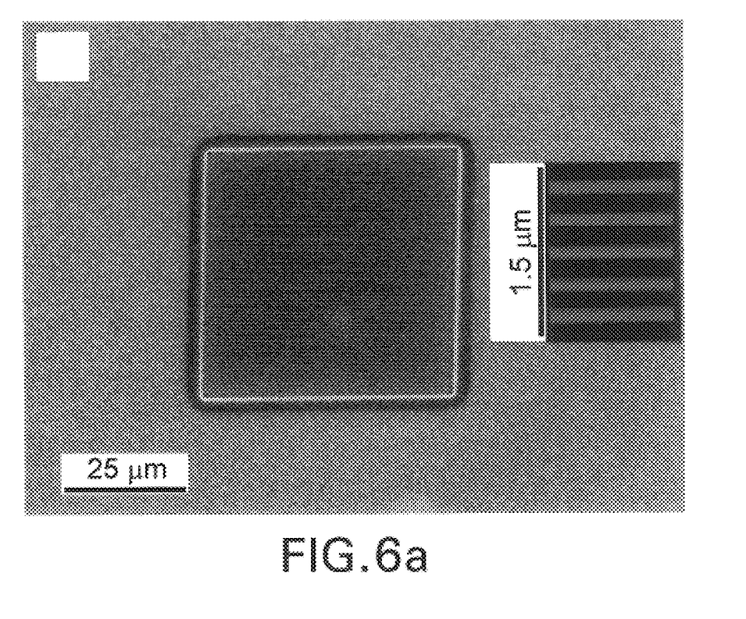
FIGS. 6a and 6b shows different etch patterns on n-type Si (100) produced by FIB-implantation of $Si^{++}$.
Figure 6B:
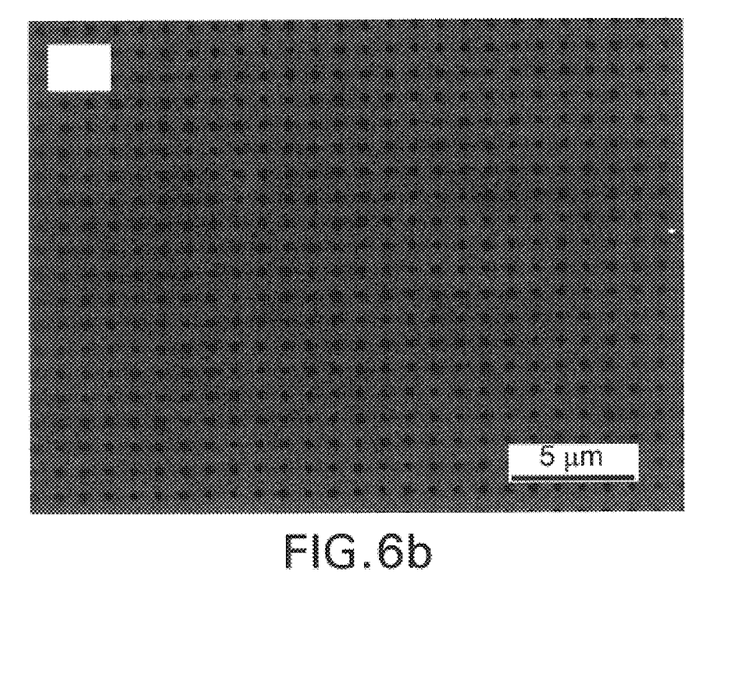

FIGS. 6a and 6b show SEM micrographs for different shapes of Si$^{++}$ implantation with an implantation dose of $10^{15}$ cm$^{-2}$ in a Si sample that was polarized to 3.5 V and held at this potential for 30 min. In FIG. 6a, within a 50×50 µm square implant lines were written with a spacing of 300 nm. After the electrochemical treatment a grating was selectively developed at the implanted region. The inset in FIG. 6a is a magnification of the pattern which shows that the etch width is about 150–200 nm, i.e., in a range corresponding to the nominal width of the implant. FIG. 6b shows arrays of pits created by FIB implanting dots which then are developed during the electrochemical treatment. The spacing between the pits is 1 pm.; the pit size is approximately 200 nm. It is noteworthy that not only for lines but also for circular shaped line implants the dissolution process occurred at the implantation and did not follow the crystal orientations of the bulk Si. This indicates that the reaction activation energy at defects is much lower than for crystal planes exposed during the dissolution.

Figure 7:
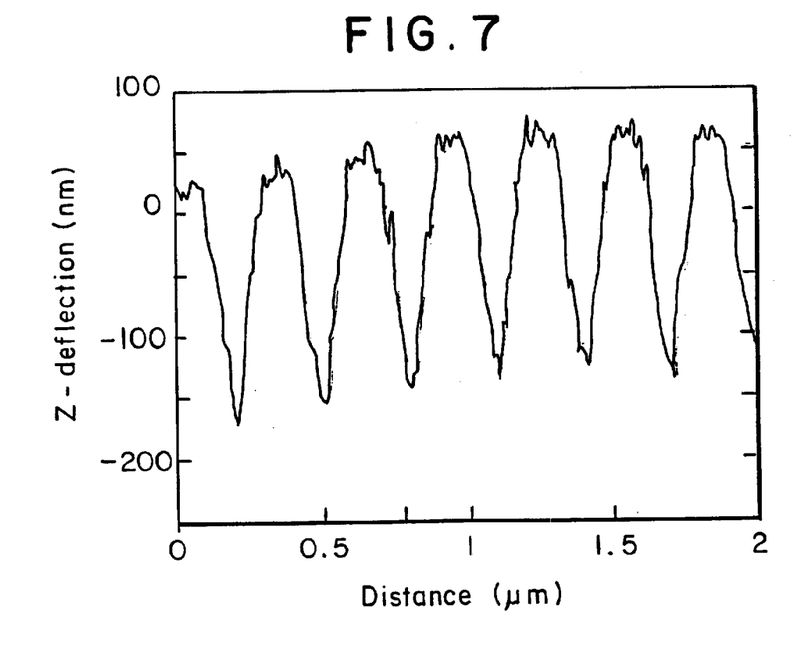

The sample shown in FIG. 6a was further studied by AFM. FIG. 7 shows a height cross section through the etched structure. From the cross section it is apparent that the grating pattern is very uniform. The width of the etched lines is approximately 200 nm, which is consistent with the SEM image, and the maximum depth of dissolution is approximately 180 nm for all the implanted lines. The cross section indicates a V-shaped geometry of the etch groove.

Figure 8:
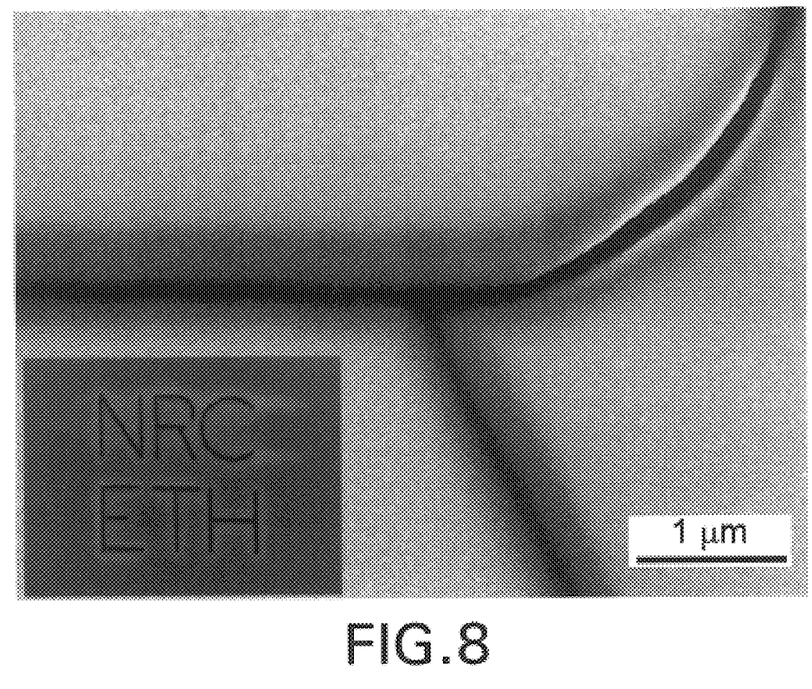
FIG. 8 is an SEM micrograph of a letter patterned on n-type Si (100) produced as in FIG. 6a but at a lower implantation dose.

For all implantation doses, a selective attack of the surface within the implanted region was observed. The adjacent surface remained completely intact. However, the morphology of the attack depends strongly on the implantation dose. For the lowest two implantation doses porous structures were formed within the implanted region; no uniform etching was observed. Such a behaviour suggests that the initiation of dissolution corresponds to the different defect densities created by different implantation doses. Further, for the lowest implantation dose, the etched regions were covered by a top layer. This top layer does not show significant attack but clearly in the SEM an underlying more severely attacked region could be seen. An example is shown in FIG. 8. In the circular part of the letter "R" the etch has opened up the implanted region completely whereas the straight segments of the letter remain covered by a top layer giving these regions an opaque appearance.

Additional experiments were carried out on identical samples polarized to lower potentials (1 VSCE, 2 VSCE) and to a potential anodic to the PFP (4.5 VSCE). In the latter case, as expected, the etch does not show selectivity and from the implanted region branching out of the dissolution process over the entire surface occurs. At 1 VSCE and 2 VSCE, attack only occurs within the implanted regions but the morphology within these regions was less defined than for the sample of FIGS. 6a and 6b.

By the same implantation/development principle it is possible to produce microstructures on GaAs when a Si$^{++}$ implanted substrate is polarized in HCl. A FIB line with a nominal width of 500 nm was implanted with a dose of $3×10^{14}$ cm$^{-2}$ on a GaAs(100) wafer. The sample was subsequently polarized in 1 M HCl to 3.0 VSCE and held there for 30 min (the PFP in this case is 3.1 VSCE). After polarization, a V-groove was formed on the surface with a top width of about 1 µm. The geometry of the groove suggests that the walls of the V-groove consist of the (111) crystal planes of GaAs. Thus it is clear that dissolution does not lead to an etch shape that is consistent with the implantation bulb. Rather, once the defective sites have been etched out, the dissolution process continues until less reactive crystal planes are encountered. It should be mentioned that for GaAs the Si$^{++}$ the implantation process leads not only to defect creation, but additionally the implanted Si acts as an n-type dopant in GaAs, and an increased dopant concentration in GaAs also leads to an enhanced dissolution.

In summary the invention permits the electrochemical formation of highly defined etch patterns in a substrate of for example, Si and GaAs on predefined surface areas that have been sensitized, for example, by FIB implantation prior to the electrochemical treatment. The effect of FIB implantation of Si$^{++}$ into Si and GaAs is to create defect sites, where selective dissolution can take place at anodic potentials below the overall dissolution potential of the intact surface. The polarization potential, the implantation dose and depth, the exposure time, and the implant geometry strongly influence the definition of the structure and determine, whether or not local electropolishing conditions are established, i.e., uniform dissolution within the implanted region takes place or whether pore formation occurs.

The process finds application in the production of extremely high resolution structures and devices. Visible light emitting patterns or etch patterns of arbitrary shape can be written down to the submicrometer scale.

We claim:

1. A precursor for a porous semiconductor device, comprising:
    a semiconductor substrate having a surface; and
    a defined pattern of crystal defects formed near said surface by implanted ions in selected regions of said substrate without amorphization of said semiconductor substrate to permit the formation of porous material in said selected regions by electrochemical etching.

2. A precursor as claimed in claim 1, wherein said crystal defects are created by ions of the same material as said semiconductor implanted in said selected regions.

3. A precursor as claimed in claim 1, wherein said semiconductor is a semiconductor containing a dopant implanted in said selected regions, and said crystal defects are created by ions of the same material as said dopant.

4. A precursor as claimed in claim 2, wherein said semiconductor is silicon.

5. A precursor as claimed in claim 3, wherein said semiconductor is GaAs and said dopant is silicon.

6. A precursor as claimed in claim 1, wherein said semiconductor device is a light emitting device.

* * * * *